(12) United States Patent
Hiwasa

(10) Patent No.: US 6,387,975 B1
(45) Date of Patent: May 14, 2002

(54) CRYSTALLINE ION-ASSOCIATION SUBSTANCE, PROCESS FOR PRODUCING THE SAME, AND LATENT PHOTOPOLYMERIZATION INITIATOR

(75) Inventor: Shin Hiwasa, Ibaraki (JP)

(73) Assignee: Autex, Inc. (JP)

( * ) Notice: Subject to any disclaimer, the term of this patent is extended or adjusted under 35 U.S.C. 154(b) by 0 days.

(21) Appl. No.: 09/463,472

(22) PCT Filed: Jul. 29, 1998

(86) PCT No.: PCT/JP98/03379

§ 371 Date: Jan. 26, 2000

§ 102(e) Date: Jan. 26, 2000

(87) PCT Pub. No.: WO99/06419

PCT Pub. Date: Feb. 11, 1999

(30) Foreign Application Priority Data

Jul. 30, 1997 (JP) ............................................. 9-219166

(51) Int. Cl.$^7$ ............................ C08F 2/48; C07F 17/02; C07F 5/02

(52) U.S. Cl. ............................ 522/81; 522/82; 556/7; 556/8

(58) Field of Search ............................ 556/7, 8; 522/81, 522/82

(56) References Cited

U.S. PATENT DOCUMENTS

| | | | |
|---|---|---|---|
| 4,772,541 A | 9/1988 | Gottschalk et al. | 430/339 |
| 4,954,414 A | 9/1990 | Adair et al. | 430/138 |
| 5,206,197 A | 4/1993 | Campbell, Jr. | 502/103 |
| 5,389,700 A | 2/1995 | Sasaki | 522/47 |
| 5,480,918 A | 1/1996 | Sasaki | 522/64 |
| 5,480,952 A | 1/1996 | Marks et al. | 526/308 |

FOREIGN PATENT DOCUMENTS

| | | |
|---|---|---|
| EP | 0421659 | 4/1991 |
| EP | 0468537 | 1/1992 |
| JP | 3124706 | 5/1991 |
| JP | 5117323 | 5/1993 |
| JP | 834810 | 2/1996 |
| JP | 995528 | 4/1997 |

OTHER PUBLICATIONS

"Recent Trends of Photo–Initiation Technology," *High Polymers, Japan*, Masahiro Tsunooka, 1996, vol. 45, No. 11, pp. 786–789.

International Search Report, Nov. 4, 1998, 1 p.

"Preparation of 1,2,3,4,5–Pentamethylcyclopentadiene, 1,2,3,4,5,5–Hexamethylcyclopentadiene, and 1,2,3,4,5–Pentamethylcyclopentadienylcarbinol", *Communications*, vol. 25, L. De Vries, Jul. 1960, p. 1838.

"Ring–Slippage Chemistry of Transition–Metal Cyclopentadienyl and Indenyl Complexes", *Chem. Rev.*, Joseph M. O'Connor et al., Mar. 1986, pp. 307–318.

"Syntheses and lipophilicities of tetraarylborate ions substituted with many trifluoromethyl groups", *Journal of Fluorine Chemistry*, Kanji Fujiki et al., Feb. 1992, pp. 307–321.

(List continued on next page.)

*Primary Examiner*—Porfirio Nazario-Gonzalez
(74) *Attorney, Agent, or Firm*—Webb Ziesenheim Logsdon Orkin & Hanson, P.C.

(57) ABSTRACT

A photo-latent initiator for photopolymerization comprises crystalline ion-association substance having the general formula (I):

$$[\{C_5(R^1)_n\}_{2m}M_m]^{l+}[\{B(R^2)_4\}^-]_l$$

Said initiator can polymerize a cationically polymerizable organic substance only with light irradiation without additional heating. It is extremely stable when stored alone or in the form of a mixture with a cationically polymerizable organic substance.

6 Claims, 2 Drawing Sheets

OTHER PUBLICATIONS

"Synthesis of Trifluoromethylated Tetraphenylborates and Solvent–extraction Properties of their Ion–associates with Alkali–metal Ions", *Applications of Tetrarylborates to the Separation of Univalent Cations*, Hiroshi Kobayashi et al., Mar. 1983, pp. 137–145.

"Anionic Phase–Transfer Catalysis with TFPB Ion.", *TFPB*, Junji Ichikawa et al., pp. 943–954.

"Electronic Structure of Various Ferricenium Systems as Inferred from Raman, Infrared, Low–Temperature Electronic Absorption, and Electron Paramagnetic Resonance Measurements", *Inorganic Chemistry*, D. Michael Duggan et al., May 1975, pp. 955–970.

"Ferromagnetic Behavior of Linear–Chain Electron–Transfer Complexes. Synthesis and Characterization of Decaethylferrocene, $Fe(C_5Et_5)_2$, and Its Electron–Transfer Salts", *Organometallics*, Kai–Ming Chi et al., Jul. 1990, pp. 688.-693.

"Convenient Preparations of 1,2,3,4,5–Pentamethylcyclopentadiene and 1–Ethyl–2,3,4,5–tetramethylcyclopentadiene", *Inorganic Chemistry*, vol. 15, No. 2, David Feitler et al., May 1975, pp. 466–469.

"A Convenient Synthesis of Alkyltetramethylcyclopentadienes and Phenyltetramethylcyclopentadiene", *Journal of Organometallic Chemistry*, Richard S. Threlkel et al., Jan. 1977, pp. 1–5.

Noth et al., Chemische Berichte, vol. 93, pp. 2238–2245, 1960.*

* cited by examiner

Crystal structure of bis(1,2,3,4,5-pentamethylcyclopentadienyl) ion/tetrakis(3,5-difluorophenyl) borate by X-ray diffraction analysis

CRYSTALLINE ION-ASSOCIATION SUBSTANCE, PROCESS FOR PRODUCING THE SAME, AND LATENT PHOTOPOLYMERIZATION INITIATOR

TECHNICAL FIELD

The present invention relates to a novel crystalline ion-association substance, a process of producing the same, and a photo-latent initiator for photopolymerization comprising the crystalline ion-association substance, which can be used in photopolymerization of cationically polymerizable organic material (the "photo-latent initiator for photopolymerization" of the present invention may be referred to "latent photopolymerization initiator").

BACKGROUND OF THE INVENTION

Cationically polymerizable organic material, especially epoxy resin, is widely used as adhesives, sealants, paints, etc. in various fields such as automobile industry, housing/building material industry, civil engineering and construction industries, aircraft industry, and electric/electronic industry.

The cationically polymerizable organic material including epoxy resin is hardened (cured) by various means for polymerization to serve as adhesives, sealants, paints, etc. Photopolymerization is one of such means for polymerization, and many initiators for cationic photopolymerization have been well known.

The typical example of the initiators for photopolymerization of cyclic ether compound or ethylene unsaturated compound is an onium salt which contains an element having a lone pair to which either a proton or other cationic compound is bonded with a coordinate bond. Particular examples of such onium salts are aromatic diazonium salts, aromatic iodonium salts, and aromatic sulfonium salts. Many of the onium salts have halogen metal complex anions ($BF_4^-$, $PF_6^-$, $AsF_6^-$, $SbF_6^-$, etc.) as counter ions.

The working mechanism of these conventional initiators for photopolymerization such as diazonium salt, iodonium salt, and sulfonium salt are shown in the following Scheme I, II, III, respectively. In any of these cases, Bronsted acid is generated at first by light irradiation.

Scheme I
(diazonium salt)

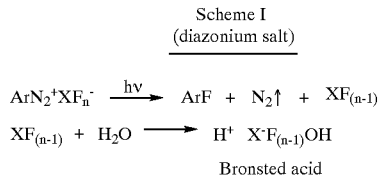

Bronsted acid

Scheme II
(iodonium salt)

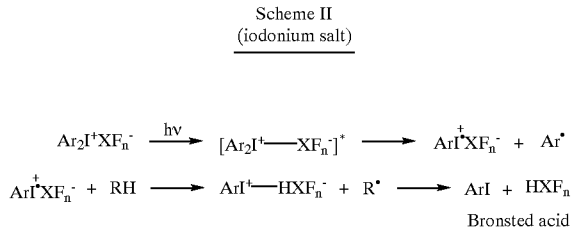

Bronsted acid

Scheme III
(sulfonium salt)

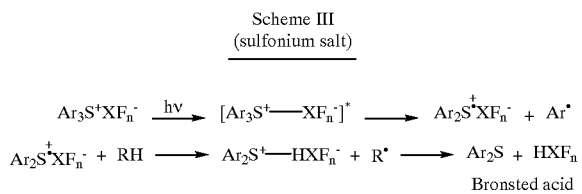

Bronsted acid

The generated Brønsted acid reacts with the cationically polymeriz able organic material and the polymerization proceeds in accordance with the following Scheme IV, whereby the polymer chain grows.

Scheme IV
(polymerization with Bronsted acid and growth reaction)

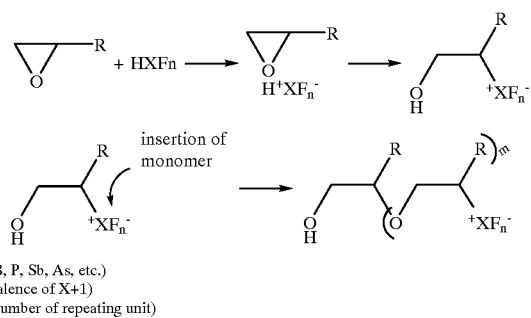

(X : B, P, Sb, As, etc.)
(n : valence of X+1)
(m : number of repeating unit)

Another example is a salt of metallocene complex. In this case, Lewis acid is produced as active species by light irradiation, and an insertion of monomer occurs at the Lewis acid, whereby the polymer chain grows in accordance with the following Scheme V.

Scheme V
(salt of metallocene complex)

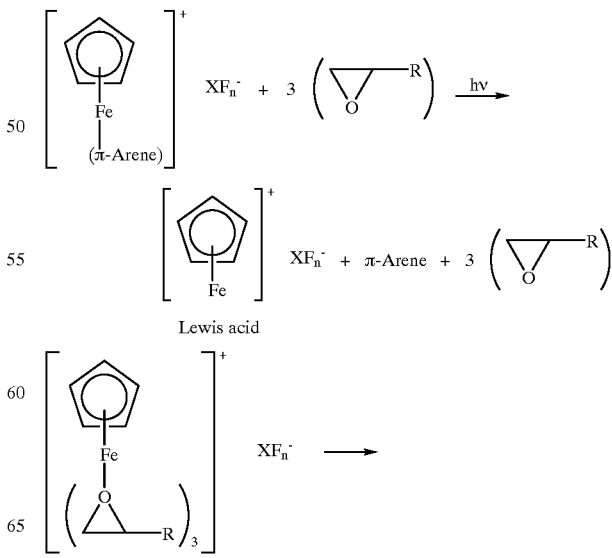

Lewis acid

-continued

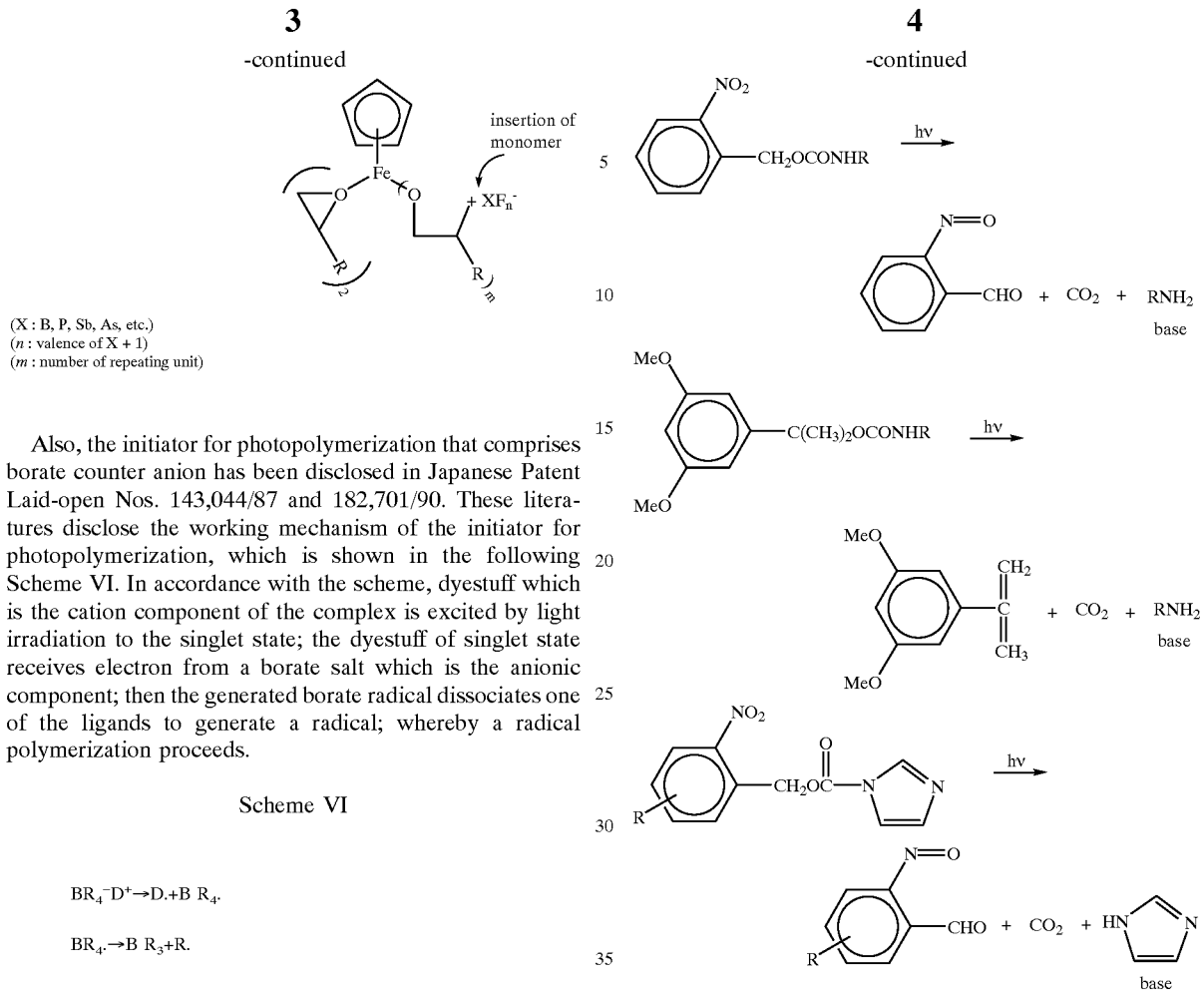

(X: B, P, Sb, As, etc.)
(n: valence of X + 1)
(m: number of repeating unit)

Also, the initiator for photopolymerization that comprises borate counter anion has been disclosed in Japanese Patent Laid-open Nos. 143,044/87 and 182,701/90. These literatures disclose the working mechanism of the initiator for photopolymerization, which is shown in the following Scheme VI. In accordance with the scheme, dyestuff which is the cation component of the complex is excited by light irradiation to the singlet state; the dyestuff of singlet state receives electron from a borate salt which is the anionic component; then the generated borate radical dissociates one of the ligands to generate a radical; whereby a radical polymerization proceeds.

Scheme VI $BR_4^- D^+ \rightarrow D\cdot + B\ R_4\cdot$ $BR_4\cdot \rightarrow B\ R_3 + R\cdot$ D: cation dyestuff or transition metal complex cation
B: boron atom
R: ligand Also, Masahiro TSUNOOKA described the anionic polymerization in which a base is generated by light irradiation (photo-initiating anionic polymerization) in *Polymers*, Vol.45, November, 786–789 (1996), but this study has just started.

In this reaction system, a problem of metal corrosion by acid, which has seen in the case of using the conventional acid-generating type initiator, does not occur; however, since the photo-initiating anionic polymerization is a consecutive reaction with respect to the base produced by light irradiation, the chain-growth reaction is difficult in comparison with the chain-growth reaction in the cationic polymerization by acid. In addition, outgassing of carbonic acid gas, and so on occurs by light irradiation, as well as production of base. Therefore, it includes some problems to be solved.

A typical example of the base-generating type initiators is shown in the following Scheme VII.

Scheme VII

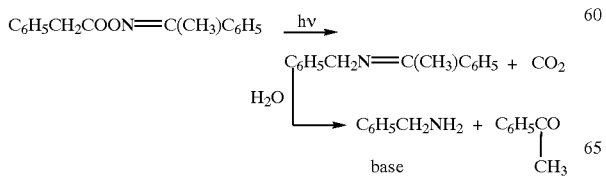

In the case of using the conventional initiator for photopolymerization in form of a homogeneous dispersion or a mixture with the cationically polymerizable material, it was impossible to completely harden the polymerizable material only by light irradiation.

Thus, since the conventional initiator for photopolymerization generates at first either Bronsted or Lewis acid or base as active species by light irradiation, the following subjects to be solved are found.

1) It is impossible to harden thick film unless using large amount of initiator or using jointly light irradiation and heating.
2) The storage stability of the composition comprising the initiator and the polymerizable organic material is poor.
3) The electrolytic corrosion to metal is strong.
4) In the production of printed circuit boards and mounting, it is impossible to accomplish fine patterning and high package density, because the conventional initiator has high dependency on heat in polymerization.
5) The produced polymer (hardening material) is deficient in resistance to moisture (water).
6) The produced polymer (hardening material) is deficient in adhesiveness to substrate.
7) The application to substrate that is apt to deform by heat is limited.
8) The inorganic halogen compound anion that is present in many of the initiators decreases diffusion properties such as affinity and compatibility between the initiator and the various components when mixed with the polymerizable material.

9) Since the photopolymerization using the base-generating type initiator (anionic polymerization type) is a consecutive reaction, it is difficult to establish the chain-growth reaction in comparison with the cationic polymerization using the acid-generating type initiator.

10) Since the polymerization (hardening) of epoxy resin by base is a stoichiometrical reaction, it is necessary to use large amount of base-generating type initiator.

11) Since the polymerization of epoxy resin by base is highly dependent on heat, a post-treatment of hardening by heat is required.

12) The base-generating type initiator produces not only the base, but also carbonic acid gas by light irradiation. Therefore, this outgassing constitutes one of the problems to be solved.

DISCLOSURE OF THE INVENTION

The inventor has earnestly tried to solve the problems of the above-mentioned conventional initiator for photopolymerization, and has found a novel photo-latent initiator for photopolymerization, which has an ability to polymerize the cationically polymerizable organic material only with light irradiation. Also, the photo-latent initiator for photopolymerization of the present invention can display a stability in any case of existing alone or in the form of a mixture with cationically polymerizable organic material and possible other additives, and does not lose the activity as initiator for photopolymerization even after long-term preservation.

According to the present invention, the photo-latent initiator for photopolymerization comprises a crystalline ion-association substance having a general formula (I):

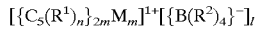

wherein M is a transition metal of center nucleus; $C_5$ is cyclopentadienyl group; $R^1$ is electron-donating substituent bonded to carbon atom of cyclopentadienyl group; $\underline{n}$ is either 4 or 5; $\underline{m}$ is either 1 or 2; $\underline{l}$ is either 1 or 2; $R^2$ is ligand coordinated to boron atom (B), and four ($R^2$)s are the same.

The crystalline ion-association substance that constitutes the photo-latent initiator for photopolymerization of the present invention is a novel substance, which constitutes one of objects of the present invention.

Thus, an object of the present invention is a novel crystalline ion-association substance having a general formula (I):

wherein M is a transition metal of center nucleus; $C_5$ is cyclopentadienyl group; $R^1$ is electron-donating substituent bonded to carbon atom of cyclopentadienyl group; $\underline{n}$ is either 4 or 5; $\underline{m}$ is either 1 or 2; $\underline{l}$ is either 1 or 2; $R^2$ is ligand coordinated to boron atom (B), and four ($R^2$)s are the same.

Another object of the present invention is a photo-latent initiator for photopolymerization of cationically polymerizable organic material, characterized in that said photo-latent initiator for photopolymerization comprises the crystalline ion-association substance having the general formula (I):

wherein M is a transition metal of center nucleus; $C_5$ is cyclopentadienyl group; $R^1$ is electron-donating substituent bonded to carbon atom of cyclopentadienyl group; $\underline{n}$ is either 4 or 5; $\underline{m}$ is either 1 or 2; $\underline{l}$ is either 1 or 2; $R^2$ is ligand coordinated to boron atom (B), and four ($R^2$)s are the same.

Also, another object of the present invention is a process of producing the novel crystalline ion-association substance having the above-mentioned formula (I), characterized in that a metallocene derivative of either mono-nucleus or di-nucleus structure having a general formula (II)

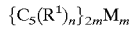

wherein M, $C_5$, $R^1$, $\underline{m}$, and $\underline{n}$ have the same meaning as mentioned above, is reacted with a tetradentate borate complex compound having a general formula (III)

wherein $R^2$ has the same meaning as mentioned above, and X is an alkali metal atom.

BEST MODE FOR CARRYING OUT THE INVENTION

Figure 1:
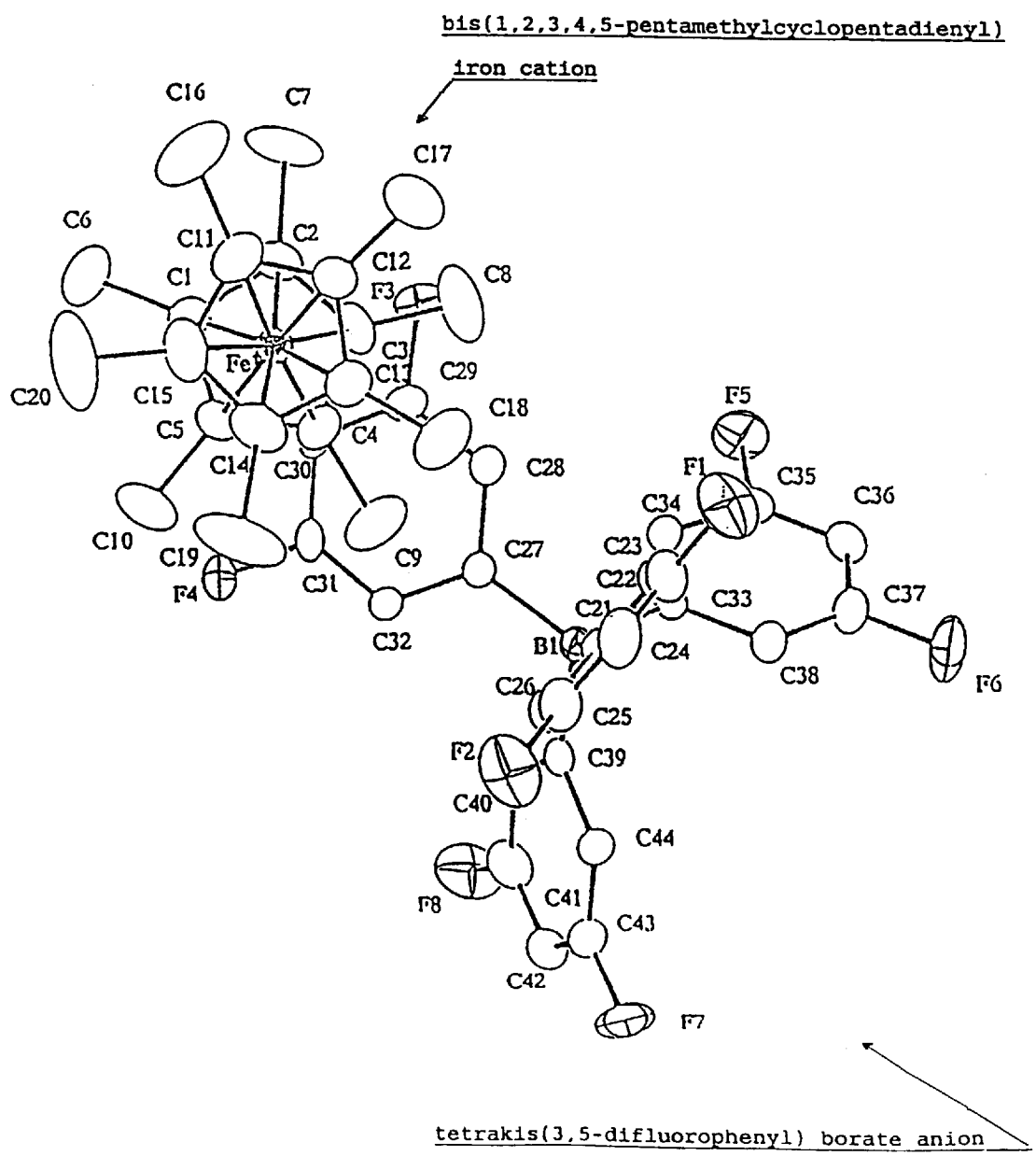
FIG. 1 is a schematic illustration showing the crystal structure of the crystalline ion-association substance of the present invention; and, FIG. 2 is a graph showing the test result relating to the property of the initiator for photopolymerization of the present invention, that is, an ability to polymerize the cationically polymerizable organic material with U.V. light irradiation only.

The photo-latent initiator for photopolymerization of the present invention comprises the crystalline ion-association substance that comprises a metallocene derivative cation and a tetradentate borate complex anion wherein the four ligands are the same as each other, the crystalline ion-association substance having the general formula (I).

The term "photo-latent" means such property that though the initiator does not display its activity under the normal conditions such as ordinary temperature and ordinary pressure, it displays the activity when light is given as an external stimulus.

In the general formula (I), the electron-donating substituent ($R^1$) is alkyl group, cycloalkyl group, aryl group, alkoxy group, silyl group, dialkyl group and the like. More specifically, the alkyl group is selected from among lower alkyl groups such as methyl group, ethyl group, propyl group, butyl group, or pentyl group, amyl group; and the cycloalkyl group is selected from among cyclobutyl group, cyclopentyl group, cycloheptyl group, and cyclohexyl group. The aryl group is selected from among phenyl group, naphthyl group, etc. The substituent ($R^1$) bonded to carbon atom of cyclopentadienyl may be either the same as or different from each other.

Also, the metallocene derivative cation which constitutes the crystalline ion-association substance having the general formula (I) may be either metallocenophane cation having mono-nucleus structure wherein the substituent on one cyclopentadienyl ring in one molecule is bonded to the substituent on another cyclopentadienyl ring in the same molecule, or dimetallocene cation having di-nucleus structure wherein the substituent on one of cyclopentadienyl rings in one molecule is bonded to the substituent on one of cyclopentadienyl rings in another molecule. The transition metal (M) of center nucleus in the general formula (I) is selected from a group consisting of Ti (IV), Zr (IV), Fe (III), Ru (III), Os (III), among them Fe (III), Ru (III), Os (III) are preferable, and Fe (III) is the most preferable.

The specific examples of the above-mentioned metallocene derivative cation are bis(1,2,3,4,5-pentamethylcyclopentadienyl)iron cation, bis(1-ethyl-2,3,4,5-tetrametylcyclopentadienyl)iron cation, bis(1-n-propyl-2,3,4,5-tetramethylcyclopentadienyl)iron cation, bis(1-phenyl-2,3,4,5-tetramethylcyclopentadienyl)iron cation, bis (1,2,3,4,5-pentaethylcyclopentadienyl)iron cation, bis(1-n-propyl-2,3,4,5-tetraethylcyclopentadienyl)iron cation, bis(1-phenyl-2,3,4,5-tetraethylcyclopentadienyl)iron cation and octamethylferrocenophane, octaethylferrocenophane, 1,2-dipermethylferrocenyl ethane, 1,2-diperethylferrocenyl ethane, etc.

On the other hand, the counter anion of the crystalline ion-association substance that constitutes the photo-latent initiator for photopolymerization of the present invention is tetradentate borate complex anion $[B(R^2)_4]^-$. In the formula, $R^2$ is a ligand coordinated to the center boron atom (B) and is selected from among aryl group, halogenated aryl group, halogen haloformaryl group, cycloalkynyl group, halogenated cycloalkyl group, halogenated cycloalkynyl group, cycloalkyloxy group, cycloalkenyloxy group, alkadienyl group, alkatrienyl group, alkynyl group, halogenated alkenyl group, halogenated alkadienyl group, halogenated alkatrienyl group, halogenated alkynyl group, heterocyclic group, etc., but the four ligands ($R^2$) are the same as each other. Also, the two adjacent ligands may chemically bond to each other to form two rings bonding the two ligands within one borate complex anion.

Specific examples of the tetradentate borate complex anion are tetrakis(4-fluorophenyl)borate anion, tetrakis(4-fluorobiphenyl)borate anion, tetrakis[3,5-bis(trifluoromethyl)phenyl]borate anion, tetrakis(3,5-difluorophenyl)borate anion, tetrakis[4-(trifluoromethyl)phenyl]borate anion, tetrakis(2,3,5,6-tetrafluorophenyl) borate anion, tetrakis(3,4,5-trifluorophenyl)borate anion, tetrakis(3-fluoropropane)borate anion, tetrakis[3,5-bis(1,1,1,3,3,3-hexafluoro-2-methoxy-2-propyl)phenyl]borate anion, tetrakis(2,4,6-trifluorophenyl)borate anion, tetrakis (nonafluorobutyl)borate anion, tetrakis(perfluorohexyl) borate anion, tetrakis(perfluoropentyl)borate anion, tetrakis (perfluorooctyl)borate anion, tetrakis(perfluoro-3-methylbutyl)borate anion, tetrakis(perfluoro-5-methylbutyl) borate anion, tetrakis(heptafluoropropyl)borate anion, tetrakis(3,5-dichlorophenyl)borate anion, tetrakis(4-chlorophenyl)borate anion, tetrakis(benzyl chloride)borate anion, tetrakis(chlorobenzyl)borate anion, tetrakis[2-(perfluorobutyl)ethyl]borate anion, tetrakis[2-(perfluorohexyl)ethyl]borate anion, tetrakis[2-(perfluorooctyl)ethyl]borate anion, tetrakis[2-(perfluoro-7-methyloctyl)ethyl]borate anion, tetrakis[2-(perfluoro-5-methylhexyl)ethyl]borate anion, tetrakis(2,2,3,3-tetrafluoropropyl)borate anion, tetrakis(1H,1H,5H-octafluoropentyl)borate anion, tetrakis(1H-perfluorohexyl) borate anion, tetrakis(1,1-difluoroethyl)borate anion, tetrakis[3,5-bis(trifluoromethyl)benzyl]borate anion, tetrakis[4-(trifluoromethyl)benzyl]borate anion, tetrakis(3,5,-difluorobenzyl)borate anion, tetrakis(4-fluorobenzyl) borate anion, tetrakis(4-ethoxyphenyl)borate anion, tetrakis (4-methoxyphenyl)borate anion, tetrakis(4,5-dimethoxyphenyl)borate anion, tetrakis(4-butylphenyl) borate anion, tetrakis(tert-butylphenyl)borate anion, tetrakis (biphenyl)borate anion, tetrakis(terphenyl)borate anion, tetrakis(mesityl)borate anion, tetrakis(pentamethylphenyl) borate anion, tetrakis[3,5-(dimethyl)phenyl]borate anion, tetrakis(cyclopropyl)borate, anion, tetrakis(cyclobutyl) borate anion, tetrakis(cyclohexyl)borate anion, tetrakis (cyclopentyl)borate anion, tetrakis(cyclooctyl)borate anion, tetrakis(phenoxybutyl)borate anion, etc.

More preferably are tetrakis(4-fluorophenyl)borate anion, tetrakis[3,5-bis(trifluoromethyl)phenyl]borate anion, tetrakis(3,5-difluorophenyl)borate anion, tetrakis[4-(trifluoromethyl)phenyl]borate anion, tetrakis[3,5-bis(1,1,1,3,3,3-hexafluoro-2-methoxy-2-propyl)phenyl]borate anion, tetrakis(4-chlorophenyl)borate anion, tetrakis(3,5-dichlorophenyl)borate anion, tetrakis[2-(perfluorobutyl) ethyl]borate anion, and tetrakis(4-fluorobiphenyl)borate anion.

The crystalline ion-association substances that constitute the photo-latent initiator for photopolymerization of the present invention contain a bulky ligand at the cation moiety, because carbon atoms of the cyclopentadienyl ligands of the metallocene derivative cation are bonded to the substituent. The attack by the active ionic compounds, atoms and soon to the transition metal center is thus prevented. Also the transition metal center with high oxidation state maintains high thermal stability owing to the presence of several electron-donating substituents, which increase synergistically the crystallinity of the ion-association substances obtained from the association of the cation moiety with the anion moiety.

The borate anion is composed of a boron atom center and four identical ligands which are situated at tetrahedral positions around the boron center. The ligand has side chain groups. Accordingly, the external factor to induce decomposition of the anion, such as attack by active compounds and/or atom, may be sterically inhibited similarly to the metallocene derivative cation. Also the electron-donating substituent such as halogen, etc. is introduced into the side chain of the ligand, and therefore the electron density of the carbon atom attached to boron atom is decreased. Whereby the boron atom center is protected from the external attack.

As a result, the photo-latent initiator for photopolymerization of the present invention is highly stable when stored alone or in the form of a mixture with cationically polymerizable organic material and possibly various additives.

Now, the process of producing the crystalline ion-association substance having the general formula (I), which constitutes the photo-latent initiator forphotopolymerization of the present invention, will be explained.

The crystalline ion-association substance is produced by reacting a metallocene derivative having the general formula (II)

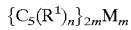

$\{C_5(R^1)_n\}_{2m}M_m$ wherein M, $C_5$, $R^1$, $\underline{m}$, and $\underline{n}$ have the same meaning as mentioned above, with a tetradentate borate complex compound having the general formula (III)

$\{B(R^2)_4\}X$ wherein B and $R^2$ have the same meanings as mentioned above, and X is alkali metal atom.

The reaction between the metallocene derivative and the borate complex compound is carried out in an acidic solvent at the mole ratio of metallocene derivative to borate complex compound of 1:1 in the case of monometallocene or of 1:2 in the case of dimetallocene and a temperature between ordinary temperature and 100° C., preferably between ordinary temperature and 60° C.

The usable acidic solvent is 3 to 50% aqueous solution of sulfuric acid, preferably 5 to 20% aqueous solution of sulfuric acid.

As other process for production, electrode oxidation method in polar solvent or oxidation method using various oxidizers (electron scavenger) may be used.

Specific examples of the crystalline ion-association substance produced by the aforesaid reaction are bis(1,2,3,4,5-pentamethylcyclopentadienyl)iron cation/tetrakis(4-fluorophenyl)borate anion, bis(1,2,3,4,5-pentamethylcyclopentadienl)iron cation/tetrakis(3,5-difluorophenyl)borate anion, bis(1,2,3,4,5-pentamethylcyclopentadienyl)iron cation/tetrakis[3,5-bis(trifluoromethyl)phenyl]borate anion, bis(1,2,3,4,5-pentamethylcyclopentadienyl)iron cation/tetrakis[4-(trifluoromethyl)phenyl]borate anion, bis(1,2,3,4,5-pentaethylcyclopentadienyl)iron cation/tetrakis(3,5-difluorophenyl)borate anion, bis(1,2,3,4,5-pentaethylcyclopentadienyl)iron cation/tetrakis[3,5-bis(trifluoromethyl)phenyl]borate anion, bis(1,2,3,4,5-pentaethylcyclopentadienyl)iron cation/tetrakis[4-(trifluoromethyl)phenyl]borate anion, octamethylferrocenophane cation/tetrakis(3,5-difluorophenyl)borate anion, and octamethylferrocenophane cation/tetrakis[3,5-bis(trifluoromethyl)phenyl]borate anion; preferably, bis(1,2,3,4,5-pentamethylcyclopentadienyl)iron cation/tetrakis(3,5-difluorophenyl)borate anion, and bis(1,2,3,4,5-pentamethylcyclopentadienyl)iron cation/tetrakis[3,5-bis(trifluoromethyl)phenyl]borate anion.

One of the desirable structures of the crystalline ion-association substance is shown in the FIG. 1. The crystalline ion-association substance has the structure wherein one of the four identical ligands of the borate complex anion is sandwiched between the two peralkylcyclopentadiene ligands of the metallocene derivative cation, in which the two peralkylcyclopentadiene with sterically bulky structure are positioned in the form of dihedral structure with respect to the transition metal center (refer to the FIG. 1).

In case that the ligand of the anion complex is a substituted phenyl group, comparing with the ligand having substituent only in para-position, the ligand having two substituents in the 3- and 5-positions enters to the deeper position between the two peralkylpentadiene ligands of the cation, and the transition metal of the cation is sandwiched by the two substituent of the ligand of the anion. Therefore, the produced ion-association substance has high crystallinity.

In photopolymerization of cationically polymerizable organic material using the photo-latent initiator for photopolymerization of the present invention, the initiator is used in the amount of from 0.1 to 10 weight parts, preferably 0.5 to 4 weight parts per 100 weight parts of the cationically polymerizable organic material; and when the cationically polymerizable organic material absorbs usually 2000 to 9000 mJ/cm$^2$ of energy by irradiation of the light having the wavelength of 200~700 nm, generally 200~400 nm, the polymer is produced. The photopolymerization proceeds under any condition of the U.V. light irradiation, that is, at an ordinary temperature, lowered temperature (cooling condition), or elevated temperature (heating condition), or under atmospheric pressure or vacuum, or in the presence of inert gases.

It is also possible to add sensitizer to the reaction system in the photopolymerization. The examples of such sensitizer are benzophenone, 4-phenylbenzophenone, 3,3-dimethyl-4-methoxybenzophenone, 4,4-dimethoxybenzophenone, thioxanthone, 2-methylthioxanthone, 2,4-dimethylthioxanthone, isopropylthioxanthone, 2,4-diethylthioxanthone, 2,4-diisopropylthioxanthone, 9,10-phenanthrenequinone, dibenzosuberone, 2-methoxynaphthalene, 4,4-diethyl isophthalophenone, anthraquinone, 2-methylanthraquinone, 2-ethylanthraquinone, hydroxyanthraquinone, aminoanthraquinone, anthraquinone sulfonic acid, acetophenone, diethoxyacetophenone, 2-ethoxy-2-phenylacetophenone, 4-methoxyacetophenone, 4,4-dimethoxyacetophenone, 4-phenylacetophenone, anthracene, 1,2-benzoanthracene, 9-cyanoanthracene, 9,10-dicyanoanthracene, 2-ethyl-9,10-dimethoxyanthracene, 9,10-bis(phenylethyl)anthracene.

Alternately, in case of using visible light, dyestuff type sensitizer such as coumarins, thiazines, azines, acridines, and xanthenes may be used.

The sensitizer is used in the amount of 0.1 to 10 weight parts, preferably 0.5 to 3 weights parts per 100 weight parts of the cationically polymerizable organic material.

The examples of cationically polymerizable organic material that can be polymerized with the photo-latent initiator for photopolymerization of the present invention are methylol compounds, ethylene unsaturated compounds, and heterocyclic compounds. Especially, compounds having cyclic ether group containing more than two carbon atoms and one oxygen atom as functional group and, in particular, epoxy compounds having cyclic ether group of three-members ring type are effective.

Some typical examples of the epoxy compound are monoepoxy compounds such as olefin oxide, butylglycidyl ether, styrene oxide, phenylglycidyl ether, and p-alkylphenolglycidyl ether which are used as a reactive diluent; polyepoxide compounds having at least two cyclic ether groups of three-members ring type in its side chain and at chain terminal, etc. in one molecule, such as, for example, cresol-novolak type epoxy resin, phenol-novolak type epoxy resin, bisphenol A type epoxy resin, bisphenol F type epoxy resin, and alicyclic epoxy compounds, etc. Also, their hydrolysis products or halogenation products such as fluorinated or brominated type compounds may be used.

Monooxetane compound having cyclic ether group of four-members ring type, and oxetane compound having more than two cyclic ether groups of four-members ring type in one molecule are also effective.

In order to verify that the photo-latent initiator for photopolymerization of the present invention has an ability to polymerize cationically polymerizable organic material only with light irradiation, the following test was carried out.

METHOD FOR TEST

To a solution obtained by dissolving, as a cationically polymerizable material, semi-solid orthocresol-novolak type epoxy resin (Nippon Kayaku Co. Ltd., Tokyo, Japan: EOCN-100) having epoxy equivalent of 195 to 205 into methyl ethyl ketone in such amount that a solution having the solid content of 50% is formed, a sensitizer, Dibenzosuberone [CAS No. 1210-35-1] was added in the amount of one weight part per 100 weight parts of the epoxy resin. Then, to the resulting solution, decamethyl ferrocene/tetrakis[3,5-bis(trifluoromethyl)phenyl]borate complex, which is one of the initiators of the present invention, was added in the amount of 0.7 weight parts per 100 weight parts of the epoxy resin, and the obtained mixture was stirred, mixed, and uniformly dispersed.

The resulting solution was applied to a surface of glass plate to form a film having the uniform dry film thickness of 50 micron, then put into a hot air circulating oven at 60° C. for 20 minutes to remove the solvent. Finally, the film was dried by maintaining in the hot air circulating oven at 80° C. for 10 minutes.

The irradiation operation was carried out with the U.V. light generated from a metal halide lamp provided with a cold mirror. The exposure amount was determined as integrating luminous energy of light with the wavelength of 365 nm. The hardness of the film was determined by a comparison with the hardness of pencil lead in accordance with JIS-K-5400.

The test pieces prepared as the mentioned above were irradiated with U.V. light starting from 1000 mJ to 4000 mJ with increments of 500 mJ in the primary irradiation step. Then, the test pieces were put into a thermostat at 140° C. for one hour, and the hardness of the test piece was measured after it was put back to the ordinary temperature. Thereafter, in the second irradiation step, each of the test pieces was irradiated with U.V. light at the exposure amount of 3000 mJ and the hardness was measured.

Figure 2:
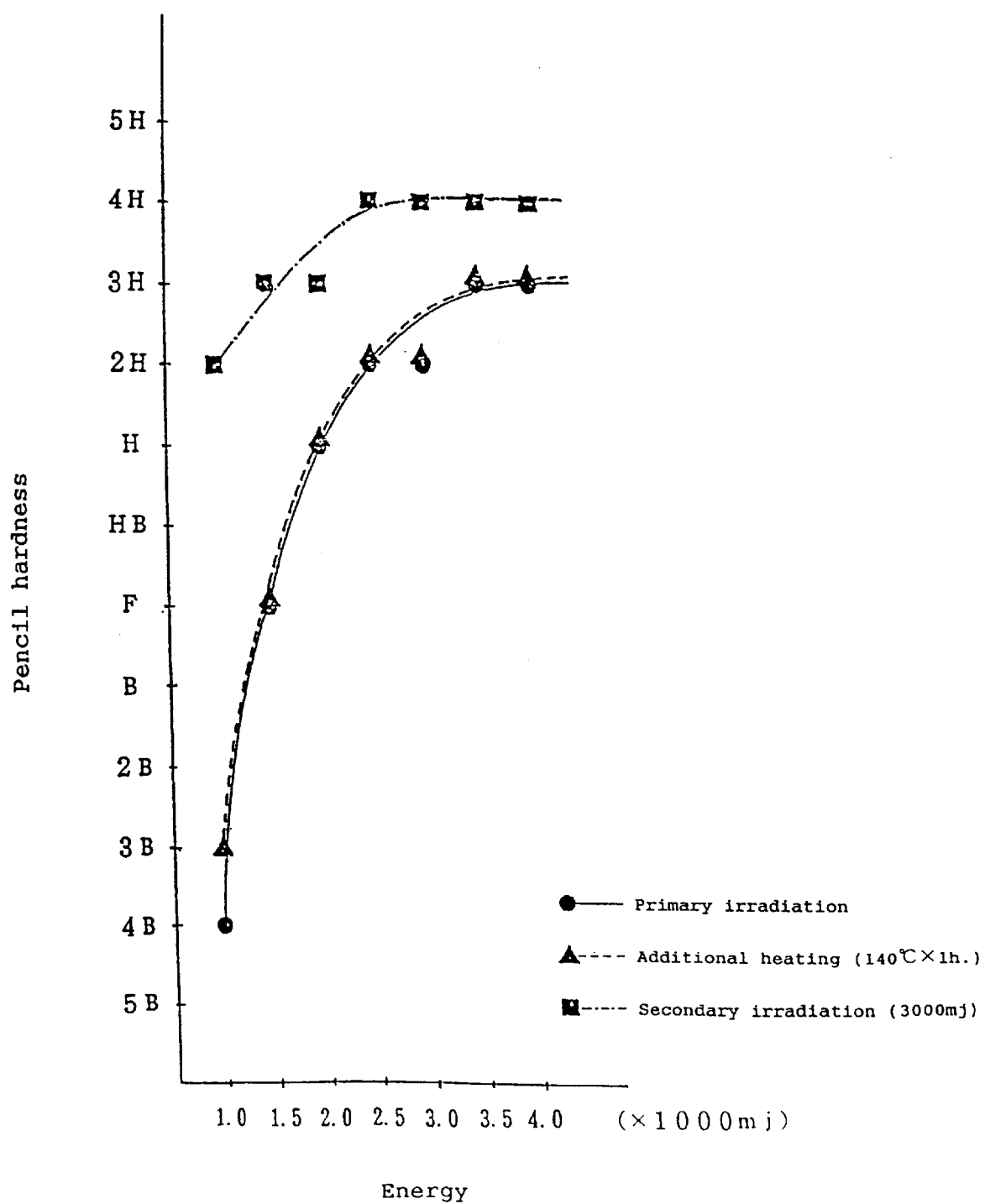

The test result was illustrated in FIG. 2 wherein the amount of energy was plotted in the abscissa and the hardness of the film was plotted in the ordinate as the pencil-hardness.

DISCUSSION OF THE RESULT

From the test result, it was seen that the photopolymerization of epoxy resin was observed in both the first and second irradiation steps; however, in the case of heating additionally the film, the polymerization was not observed. From this fact, it was confirmed that the initiator of the present invention shows its activity only in the case of irradiating with U.V. light.

Although the reaction mechanism of the photopolymerization of the cationically polymerizable organic material using the initiator for photopolymerization of the present inventionhas not been fully clarified, it is understood as follows.

As apparent from the X-ray structural analysis shown in the FIG. 1, each of the two permethylcyclopentadienyl ligands of the ferrocenium cation coordinates to Fe centervia its five carbon atoms. On irradiation with U.V. light, a part of the initiator is capable of transforming into active species (X) with a different structure, as shown in the following Scheme VIII. In the active species (X), one of the two permethylcyclopentadienyl ligands coordinates to the Fe center via three carbon atoms, whereby the steric hindrance around the Fe atom is released.

The fact that the coordination mode of permethyleyclopentadienyl ligand changes depending on the conditions has been observed in many organic metal complexes (for example, J. M. O'Connor, C. P. Casey, Chem. Rev. 87, p.307–318 (1987)).

In the absence of a monomer, the active species (X) is returned to the original ground state again. As a result, under light irradiation, an equilibrium mixture of the original ground state and the active species (X) is formed. In the presence of a monomer, however, the ferrocenium cation moiety in the active species (X), with a small degree of steric hindrance around Fe atom, initiates a polymerization at the Fe center of the cation moiety, and causes propagation of the polymer by repeated insertion of monomer.

Scheme VIII
Presumable Reaction Mechanism

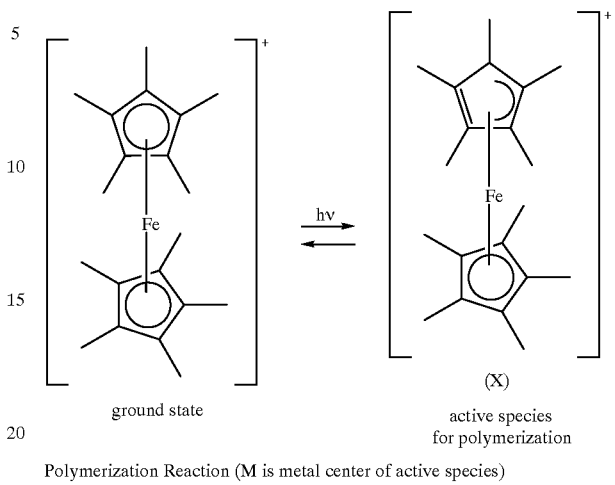

ground state      active species for polymerization

Polymerization Reaction (M is metal center of active species)

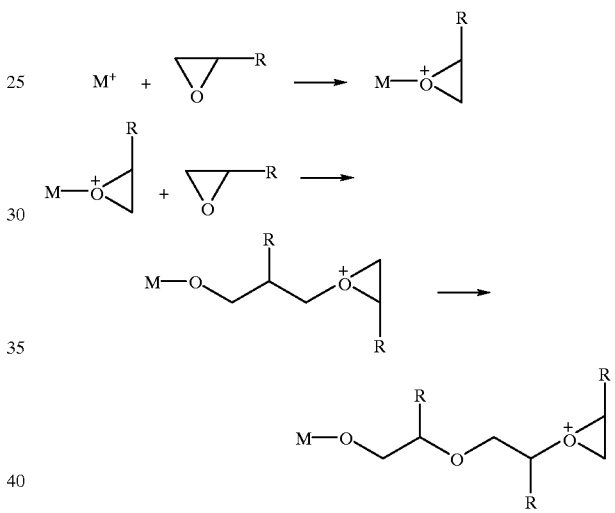

On the other hand, though the polymerization reaction is partly halted by a chain transfer and so on, the U.V. light irradiation keeps generating the active species (X) by the photo-excitation. The produced active species-initiates polymerization. Thus, under irradiation of U.V. light, the continuous transformation of monomer to polymer occurs, but cutting-off of U.V. light stops generation of the new active species for polymerization reaction. Therefore, when the existing active species is exhausted, the polymerization itself terminates. Since the initiator for photopolymerization of the present invention is photo-latent and does not produce the active species (X) by heating, the polymerization by heating does not occur. This fact agrees with the above-mentioned test result (the hardness does not rise with the additional heating).

The initiator for photopolymerization of the present invention is different from the conventional initiators for cationic polymerization in the following points.

The conventional initiator for cationic polymerization initiates the polymerization via dissociation between cation and counter anion. Since the dissociation is generated thermally, it is impossible to avoid a thermal polymerization that may occur together with the photopolymerization.

In addition, as mentioned above, the initiator for photopolymerization of the present invention is extremely stable when stored alone or in the form of a mixture with either cationically polymerizable organic materials or other conventional additives, and it does not lose the photopolymerization activity even after a long-term preservation.

In order to verify the stability, the following test has been made.

EXPERIMENTAL METHOD AND RESULT

As one of indicators showing the stability of the initiator for photopolymerization of the present invention when existing alone, the thermal decomposition temperature was measured, and the obtained results were compared with those of the conventional initiators.

In the tests, the initiators A and B of the present invention and the conventional initiators C and D (for comparison) were used.

A: bis(1,2,3,4,5-pentamethylcyclopentadienyl)iron/tetrakis(3,5-difluorophenyl)borate B: bis(1,2,3,4,5-pentamethylcyclopentadienyl)iron/tetrakis[3,5-bis(trifluoromethyl)phenyl]borate C: diallyl iodonium/$PF_6$ salt (melting point 171~174° C.)

D: diallyl iodonium/$SbF_6$ salt (melting point 183~185° C.)

The temperature at which a change of weight in the respective initiators by heating starts to occur was measured by a thermogravimetric analyzer (TGA-50; SHIMADZU Corp.).

The temperature program was set as follows: heating speed of 10.0° C./min., holding temperature of 700.0° C., and holding time of 1.0 min.

TABLE 1

| Initiator | Decomposition-Starting Temperature |
|---|---|
| A | 287° C. |
| B | 317° C. |
| C | 176° C. |
| D | 145° C. |

From the results shown in Table 1, it is clear that the thermal stability of the initiator of the present invention is very high in comparison with the conventional initiators comprising an organometallic complex.

In order to examine the stability of the initiator of the present invention when existing in the form of a mixture, the following test was conducted.

An alicyclic epoxy resin, ARALDITE CY-176 (registered trademark) made by Ciba-Geigy, was previously dissolved into methyl ethyl ketone to prepare a solution having the solid content of 90%. The initiator of the present invention was added to the resulting solution in the amount of 0.0000361 mol per 1 g of the epoxy resin. The solution was stirred, mixed, and dispersed uniformly. The obtained solution was poured into a container, and the container was sealed, placed into a thermostat at 70° C., then the change in viscosity with time caused by the polymerization of epoxy resin which is induced by decomposition of the initiator was measured. The measurement of viscosity was carried out in accordance to JIS K-6833. For comparison, the same procedures were repeated with the conventional initiators for photopolymerization.

The results are shown in Table 2. The initiators A to D are the same as those used in the aforesaid tests.

TABLE 2

| | | | | | Time (hours) | | | | | | |
|---|---|---|---|---|---|---|---|---|---|---|---|
| Initiator | Blank | 50 | 100 | 150 | 200 | 250 | 300 | 350 | 400 | 450 | 500 |
| A | 80 | 90 | 95 | 100 | 100 | 100 | 100 | 100 | 100 | 100 | 100 |
| B | 75 | 85 | 90 | 95 | 100 | 100 | 100 | 100 | 100 | 100 | 100 |
| C | 80 | 100 | 150 | 220 | 260 | 1050 | 11200 | * | — | — | — |
| D | 80 | 210 | * | — | — | — | — | — | — | — | — |

Unit: cps
*: unable to measure due to gellation

From this result, it is clear that the initiators for photopolymerization of the present invention are highly stable even when stored in the form of a mixture with cationically polymerizable organic material.

The initiator for photopolymerization of the present invention has the following characteristics, in addition to the above-mentioned photo-latent and stability properties:

I) in the case that the initiator exists alone,
  (a) it is highly resistant to heat, moisture (water), acid, and alkali;
  (b) it has good solubility in cationically polymerizable organic material such as epoxy resin;
  (c) it can easily be mixed with the cationically polymerizable material such as epoxy resin, etc. by fusion, and therefore it can form a mixture without solvent;

II) in the case that the initiator exists in the form of a mixture with the cationically polymerizable organic material,
  (a) it has an ability to harden thick film even when it is used in a small amount (0.5~1%);
  (b) it is not subjected to decomposition by moisture (water) in the mixture;
  (c) it has good stability in viscosity of the mixture (long-term shelf life), and III) as to the characteristics of the hardening product formed by the photopolymerization,
  (a) the hardening product has electrolytic corrosion resistance, for example, it shows no electrolytic corrosion on copper-clad plate;
  (b) the hardening product has the substantially unchanged characteristics of the starting material itself, for example, when it is mixed with a cationically polymerizable material, for example, epoxy resin, etc., the obtainable hardening product has the unchanged characteristics inherent to epoxy resin.

Also, the polymerization (hardening) can be progressed by the second, third irradiation steps.

Now, the invention will be explained in more detail with the following examples; however, these examples are intended to illustrate the invention and are not to be construed to limit the scope of the invention.

In preparation of the crystalline ion-association substance that constructs the initiator for photopolymerization of the present invention, commercially available decamethyl ferrocene (sold by Aldrich Co.) was used. As to the method for synthesis of other metallocene derivatives, the following references were referred.

a) precursors

L. DeVRIES, J. Org. Chem., 25 1838 (1960)

R. S. THRELKEL, J. E. BERCAW., J. Organometallic Chemistry, 136 1~5 (1977)

D. FEITLER, G. M. WHITESIDES., Inorg. Chem. Vol.15, No.2, 466 (1976)

b) metallocene derivatives

D. M. DUGGAN, D. N. HENDRICKSON., Inorg. Chem. Vol.14, No.5, 955 (1975)

KAI-MING, J. C. CALABRESE, W. M. BEIFF, J. S. MILLER., Organometallics, 10 688~693 (1991)

Also, among the tetradentate borate complex compounds, a commercially available product (sold by DOJIN CHEMICALS Co.) can be used as tetrakis[3,5-bis(trifluoromethyl) phenyl borate sodium salt, but, for example, tetrakis(3,5-difluorophenyl)borate complex compound may be prepared as described in the following Reference Example.

REFERENCE EXAMPLE

Synthesis of Tetrakis(3,5-difluorophenyl)borate Sodium Salt

A dried flask made of Pyrex glass (capacity of 500 ml) provided with a reflux condenser was charged with an inert gas to purge the air from the flask. Then, metallic magnesium (4.65 g) and anhydrous diethyl ether (100 ml) were fed to the flask, and the resulting solution was stirred and cooled by ice bath. A solution prepared separately by adding anhydrous diethylether (50 ml) to 1-bromo-3,5-difluorobenzene (43.52 g) was added dropwise thereto over one hour, and the resulting solution was left still for three hours. At the end of the reaction, a liquid containing boron trifluorideethercomplex (4.542 g) in anhydrous diethyl ether was added dropwise over 40 minutes, and left still for 16 hours with stirring at the room temperature. Then, an aqueous solution of sodium carbonate (30 g) in pure water (100 g) was dropped with 30 minutes. After the solution was kept stirring at the room temperature for 24 hours, the water phase and the organic phase were separated from each other. The separated organic phase was dried with sodium sulfate and filtered; the filtrate was put into an evaporator (oil bath temperature: 70° C.); and diethyl ether was evaporated, thereby obtaining a liver-brown colored solid. The liver-brown colored solid was further purified with silica gel, and a white solid of tetrakis(3,5-difluorophenyl)borate sodium salt (10.3 g) was obtained.

The following literatures were referred.

H. KOBAYASHI, T. SONODA, Y. INUKAI, K. TAKUMA., *Technical Reports of ASAHI GLASS CO. LTD*, 42 (1983)

J. ICHIKAWA, H. KOBAYASHI, T. SONODA., *Organic Synthetic Chemistry*, 46, 943~953 (1988)

K. FUKUI, M. KASHIWAGI, H. MIYAMOTO, A. SONODA, J. ICHIKAWA, H. KOBAYASHI, T.SONODA., *J. Fluorine Chem.*, 57, 307~321(1992)

EXAMPLE 1

Synthesis of Decamethyl Ferrocene/tetrakis(3,5-difluorophenyl)borate

In a dried eggplant-type flask made of Pyrex glass (capacity of 300 ml) provided with amagnetic stirrer, 1 g of commercially available decamethyl ferrocene (sold by Aldrich Co.) was added to log of conc. sulfuric acid. The resulting solution was stirred at room temperature for 16 hours, and then 100 ml of pure water was gradually added thereto. The flask containing the solution was cooled, and the solution was filtered with PTFE filter paper. The filtrate was heated by a water bath to 60° C. with stirring, then 5 ml of ethanol solution containing 1.49 g of tetrakis (3,5-difluorophenyl)borate sodium salt was added. A blue-green colored crystal precipitated.

The precipitate was filtered, washed with pure water, dried by evaporator, washed with toluene, and dried again by evaporator.

By this process, 1.40 g of decamethyl ferrocene/tetrakis (3,5-difluorophenyl)borate was obtained (yield 58%).

The identification of the obtained substance was carried out by $^1$H-NMR analysis (Nuclear Magnetic Resonance Equipment EX-400, NEC Co.), and the following data was obtained.

$^1$HNMR [25° C., deuterated acetone, chemical shift of peak (ppm)]:

$CH_3$ 23.21, o- 6.81, m-, p- 6.72; IR: CH stretching vibration 2916 $cm^{-1}$.

EXAMPLE 2

Synthesis of Decamethyl Ferrocene/tetrakis[3,5-bis (trifluoromethyl)phenyl]borate In the same flask to that used in Example 1, 1 g of decamethyl ferrocene was added to 15 g of conc. sulfuric acid. The resulting solution was stirred at room temperature for 16 hours, and then 100 ml of pure water was added thereto. The flask containing the solution was cooled, and the solution was filtered with PTFE filter paper. The filtrate was heated by water bath to 70° C. with stirring, then 7 ml of ethanol solution containing 2.83 g of tetrakis[3,5-bis (trifluoromethyl)phenyl]borate sodium salt (sold by DOJIN CHEMICALS CO.) was added. A blue-green colored crystal precipitated.

The precipitate was filtered, washed with pure water, dried by evaporator, washed with toluene, and dried again by evaporator.

By this process, 1.86 g of decamethyl ferrocene/tetrakis [3,5-bis(trifluoromethyl)phenyl]borate was obtained (yield 51%).

The identification was carried out by $^1$H-NMR analysis similarly to the Example 1, and the following data was obtained.

$^1$HNMR [25° C., deuterated acetone, chemical shift of peak(ppm)]: $CH_3$ 23.22, o- 7.78, m-, p- 7.68; IR: CH stretching vibration 2920 $cm^{-1}$.

EXAMPLE 3

Synthesis of Decamethyl Ferrocene/tetrakis[4-(trifluoromethyl)phenyl]borate

By using the same apparatus and procedure as those in the Example 1, 1.08 g of decamethyl ferrocene/tetrakis[4-(trifluoromethyl)phenyl]borate (yield 38%) was obtained starting from 1 g of decamethyl ferrocene, 15 g of conc. sulfuric acid, 1.88 g of tetrakis[4-(trifluoromethyl)phenyl] borate sodium salt, and 5 ml of ethanol.

The identification was carried out by $^1$H-NMR analysis similarly to the Example 1, and the following data was obtained.

$^1$HNMR [25° C., deuterated acetone, chemical shift of peak(ppm)]: CH$_3$ 23.25, o- 7.48, m- 7.53, p- –; IR: CH stretching vibration 2915 cm$^{-1}$.

EXAMPLE 4

Synthesis of Decamethyl Ferrocene/tetrakis(4-fluorophenyl)borate

In the same flask as that used in Example 1, 1 g of decamethyl ferrocene was added to 5 g of conc. sulfuric acid. The resulting solution was stirred at room temperature for 16 hours, and then 100 ml of pure water was added thereto. The flask containing the solution was cooled, and the solution was filtered with PTFE filter paper. To the filtrate, 20 ml of an aqueous solution containing 1.38 g of tetrakis(4-fluorophenyl)borate sodium salt (DOJIN CHEMICALS CO.) was added with stirring at room temperature. A blue-green colored crystal precipitated.

The precipitate was filtered, washed with pure water, dried by evaporator, washed with toluene, and dried again by evaporator.

By this process, 0.87 g of decamethyl ferrocene/tetrakis(4-fluorophenyl)borate was obtained (yield 40.48%).

The identification was carried out by $^1$H-NMR analysis similarly to the Example 1, and the following data was obtained.

$^1$HNMR [25° C., deuterated acetone, chemical shift of peak(ppm)]: CH$_3$ 23.19, o- 7.45, m- 7.00, p- –; IR: CH stretching vibration 2916 cm$^{-1}$.

EXAMPLE 5

Synthesis of Decamethyl Ferrocene/tetrakis[3,5-bis(1,1,1,3,3,3-hexafluoro-2-methoxy-2-propyl)phenyl]borate In the same flask to that used in Example 1, 0.3 g of decamethyl ferrocene was added to 15 g of conc. sulfuric acid. The resulting solution was stirred at room temperature for 16 hours, and then 100 ml of pure water was gradually added thereto. The flask containing the solution was cooled, and the solution was filtered with PTFE filter paper. The filtrate was heated by water bath to 80° C. with stirring, then 5 ml of acetone solution containing 1.69 gof tetrakis[3,5-bis(1,1,1,3,3,3-hexafluoro-2-methoxy-2-propyl)phenyl]borate sodium salt (DOJIN CHEMICALS CO.) was added. A blue-green colored crystal precipitated.

The precipitate was filtered, washed with pure water, dried by evaporator, washed with toluene, and dried again by evaporator.

By this process, 1.02 g of decamethyl ferrocene/tetrakis[3,5-bis(1,1,1,3,3,3-hexafluoro-2-methoxy-2-propyl)phenyl]borate was obtained (yield 52.53%).

The identification was carried out by $^1$H-NMR analysis similarly to Example 1, and the following data was obtained.

$^1$HNMR [25° C., deuterated acetone, chemical shift of peak(ppm)]: CH$_3$ 23.26, o- 7.57, m- –, p- 7.41, OCH$_3$ 3.29.

EXAMPLE 6

Synthesis of Decamethyl Ferrocene/tetrakis(4-chlorophenyl)borate

In the same flask to that used in the Example 1, 1 g of decamethyl ferrocene was added to 10 g of conc. sulfuric acid. The resulting solution was stirred at room temperature for 16 hours, and then 100 ml of pure water was gradually added thereto. The flask containing the solution was cooled, and the solution was filtered with PTFE filter paper. The filtrate was heated by water bath to 60° C. with stirring, then 5 ml of ethanol solution containing 1.52 g of tetrakis(4-chlorophenyl)borate potassium salt (DOJIN CHEMICALS CO.) was added. A blue-green colored crystal precipitated.

The obtained precipitate was filtered, washed with pure water, dried by evaporator, washed with toluene, and evaporated again by evaporator.

By this process, 1.26 g of decamethyl ferrocene/tetrakis(4-chlorophenyl)borate was obtained (yield 52.62%).

The identification was carried out by $^1$H-NMR analysis similarly to the Example 1, and the following data was obtained.

$^1$HNMR [25° C., deuterated acetone, chemical shift of peak(ppm)]: CH$_3$ 23.24, o- 7.42, m- 7.29, p- –; IR: CH stretching vibration 2910 cm$^{-1}$.

EXAMPLE 7

Synthesis of Decamethyl Ferrocene/tetrakis(biphenyl)borate

In the same flask to that used in Example 1, 1 g of decamethyl ferrocene was added to 5 g of conc. sulfuric acid. The resulting solution was stirred at room temperature for 16 hours, and then 100 ml of pure water was gradually added thereto. The flask containing the solution was cooled, and the solution was filtered with PTFE filter paper. While the filtrate was stirred at room temperature, 5 ml of ethanol solution containing 1.98 g of tetrakis(biphenyl)borate sodium salt (DOJIN CHEMICALS CO.) was added. A blue-green colored crystal precipitated.

The precipitate was filtered, washed with pure water, dried by evaporator, washed with toluene, and evaporated again by evaporator.

By this process, 1.54 g of decamethyl ferrocene/tetrakis(biphenyl) borate was obtained (yield 53%). IR: CH stretching vibration 2973 cm$^{-1}$.

EXAMPLE 8

Synthesis of Decamethyl Ferrocene/tetrakis[2-(perfluorobutyl)ethyl]borate

In the same flask to that used in Example 1, 0.5 g of decamethyl ferrocene was added to 15 g of conc. sulfuric acid. The resulting solution was stirred at room temperature for 16 hours, and then 1OOml of pure water was gradually added thereto. The flask containing the solution was cooled, and the solution was filtered with PTFE filter paper. The filtrate was heated by water bath to 80° C. with stirring, and then 15 ml of acetone solution containing 3.06 g of tetrakis[2-(perfluorobutyl)ethyl]borate sodium crude crystal was added thereto. A blue-green colored liquid substance precipitated.

The precipitated substance was filtered from the reaction solution, washed with pure water, dried by evaporator, washed with toluene, and evaporated again by evaporator.

By this process, 0.83 g of crude tetrakis[2-(perfluorobutyl)ethyl]borate was obtained.

EXAMPLE 9

Synthesis of Decamethyl Ferrocene/tetrakis[2-(perfluoro-7-methyloctyl)ethyl]borate By using the same apparatus and procedure to those used in Example 1, 1.67 g of decamethyl ferrocene/tetrakis[2-

(perfluoro-7-methyloctyl)ethyl]borate was obtained starting from 0.5 g of decamethyl ferrocene, 15 g of conc. sulfuric acid and 15 ml of acetone solution containing 4.5 g of tetrakis[2-(perfluoro-7-methyloctyl)ethyl]borate sodium crude crystal substance.

The photopolymerization of epoxy resin was carried out by using as initiator for photopolymerization the various crystalline ion-association substances of metallocene derivative/tetradentate borate complex prepared in the above-mentioned Examples 1 to 9, and the following results were obtained.

EXAMPLES 10~16

To a solution obtained by dissolving phenol-novolak type epoxy resin (epoxy equivalent of 170 to 190; DAINIPPON INK & CHEMICALS, INC., EPICRON (registered trademark)) into methyl ethyl ketone in such amount that a solution having the solid content of 50% is prepared, each of the initiators prepared in the above-mentioned Examples 1 to 7 was added in the determined amount per 100 weight parts of the resin. The resulting solution was stirred, mixed, and dispersed uniformly. The solution was applied on a surface of glass plate at the thickness (as dry film) of about 50 μm, then put into a 60° C. hot air circulating oven for 20 minutes to remove the solvent. Finally, the film was dried by maintaining in a hot air circulating oven at the temperature of 80° C. for 10 minutes. The obtained film was used as a test piece.

The irradiation operation was carried out with the U.V. light generated by a metal halide lamp provided with a cold mirror. The exposure amount was determined as integrating luminous energy of light having the wavelength of 365 nm.

The hardness of the film was determined by a comparison with the pencil hardness in accordance with JIS-K-5400.

Each test piece was irradiated with U.V. light at the exposure amount of 8000 mJ/cm$^2$. The amount of initiator (as weight parts per 100 weight parts of the resin) and the hardness of the film are shown in the following Table 3.

TABLE 3

| Example No. | Initiator | Amount of initiator | Hardness of film |
| --- | --- | --- | --- |
| 10 | Example 1 | 1 | 2H |
| 11 | Example 2 | 1 | H |
| 12 | Example 3 | 1 | H |
| 13 | Example 4 | 3 | B |
| 14 | Example 5 | 1 | 3H |
| 15 | Example 6 | 1 | H |
| 16 | Example 7 | 3 | B |

EXAMPLES 17~24

To a solution obtained by dissolving semi-solid orthocresol-novolak type epoxy resin (Nippon Kayaku Co. Ltd.: EOCN-100) into methyl ethyl ketone in such amount that a solution having the solid content of 50% is prepared, a sensitizer, Dibenzosuberone [CAS No.1210-35-1], was added in the amount of one weight part per 100 weight parts of the resin. Then, to the resulting solution, each of the initiators for photopolymerization prepared in the Examples 1~8 was added in the predetermined amount. The resulting solution was stirred, mixed, and dispersed uniformly. The solution was applied on a surface of glass plate to form a film having the uniform thickness (as dry film) of about 50 μm. The obtained film was put into hot air circulating at 60° C. oven for 20 minutes to remove the solvent, and dried by maintaining in hot air circulating oven at 80° C. further 10 minutes.

The irradiation operation was carried out with the U.V. light generated by a metal halide lamp provided with a cold mirror. The exposure amount was determined as integrating luminous energy of light of 365 nm.

The hardness of the film was determined by a comparison with the pencil in accordance with JIS-K-5400.

Each test piece was irradiated with U.V. light at the exposure amount of 6000 mJ/cm$^2$. The amount of initiator (as weight parts per 100 weight parts of the resin) and the hardness of the film are shown in the following Table 4.

TABLE 4

| Example No. | Initiator | Amount of initiator | Hardness of film |
| --- | --- | --- | --- |
| 17 | Example 1 | 1 | 2H |
| 18 | Example 2 | 1 | 3H |
| 19 | Example 3 | 1 | 3H |
| 20 | Example 4 | 2 | 4B |
| 21 | Example 5 | 1 | H |
| 22 | Example 6 | 1 | F |
| 23 | Example 7 | 2 | 2B |
| 24 | Example 8 | 1 | H |

EXAMPLES 25~31

To alicyclic epoxy resin [sold by Ciba-Geigy; ARALDITE (registered trademark) CY-179], each of the initiators for photopolymerization prepared in the Examples 1~6 and 8 and the sensitizer, Dibenzosuberone [CAS No. 1210-35-1], were added in the amount of one weight part per 100 weight parts of the resin, respectively, without using a diluent. The mixture was heated at 100° C., stirred, and mixed. The obtained solution in which the starting materials were uniformly dissolved was applied on a surface of glass plate at the thickness of 50 μm, and the U.V. light was irradiated (6000 mJ/cm$^2$).

The irradiation of U.V. light and the measurement of the hardness of film were similarly proceeded to the above-mentioned Examples 17~24.

The amount of initiator (as weight parts per 100 weight parts of the resin) and the hardness of film are shown in the following Table 5.

TABLE 5

| Example No. | Initiator | Amount of initiator | Hardness of film |
| --- | --- | --- | --- |
| 25 | Example 1 | 1 | 4H |
| 26 | Example 2 | 1 | 3H |
| 27 | Example 3 | 1 | 2H |
| 28 | Example 4 | 2 | 2H |
| 29 | Example 5 | 1 | 4H |
| 30 | Example 6 | 1 | 4B |
| 31 | Example 8 | 1 | 2H |

EXAMPLES 32~40

The operation and the test were carried out in accordance with the procedure similar to the Examples 17~24, using phenol-novolak type epoxy resin [epoxy equivalent of 170~190; DAINIPPON INK & CHEMICALS, INC., EPI-CRON (registered trademark) N-730 A].

The amount of initiator (as weight parts per 100 weight parts of the resin) and the hardness of film are shown in the following Table 6.

TABLE 6

| Example No. | Initiator | Amount of initiator | Hardness of film |
| --- | --- | --- | --- |
| 32 | Example 1 | 1 | 3H |
| 33 | Example 2 | 1 | 4H |
| 34 | Example 3 | 1 | H |
| 35 | Example 4 | 2 | B |
| 36 | Example 5 | 1 | HB |
| 37 | Example 6 | 1 | F |
| 38 | Example 7 | 2 | 2B |
| 39 | Example 8 | 1 | H |
| 40 | Example 9 | 2 | 4B |

EXAMPLES 41~48

The operation and the test were carried out in accordance with the procedure similar to the Examples 25~31, using 3,4-epoxycyclohexylmethyl 3,4-epoxycyclohexane carboxylate [CAS No. 2386-87-0].

The amount of initiator (as weight parts per 100 weight parts of the resin) and the hardness of film are shown in the following Table 7.

TABLE 7

| Example No. | Initiator | Amount of initiator | Hardness of film |
| --- | --- | --- | --- |
| 41 | Example 1 | 1 | 4H |
| 42 | Example 2 | 1 | 4H |
| 43 | Example 3 | 1 | 2H |
| 44 | Example 4 | 2 | H |
| 45 | Example 5 | 1 | 3H |
| 46 | Example 6 | 1 | 2B |
| 47 | Example 8 | 1 | 4H |
| 48 | Example 9 | 2 | 5H |

EXAMPLES 49~54

To a solution obtained by dissolving oxetane derivative, poly[{3,3-(2-oxytrimethylene)-1-oxypentyl}-1,4-toluylene], into methyl ethyl ketone in such amount that a solution having the solid content of 60% prepared, a sensitizer, Dibenzosuberone [CAS No. 1210-35-1], was added in the amount of one weight part per 100 weight parts of the oxetane derivative. Then, to the resulting solution, each of the initiators prepared in the Examples 1~6 was added, stirred, mixed, and dispersed uniformly. The solution was applied on a surface of glass plate at the thickness (as dry film) of 50 μm, put into hot air circulating oven at 60° C. for 20 minutes to remove the solvent, and dried by maintaining in a hot air circulating oven at the temperature of 80° C. for further 10 minutes to obtain test pieces.

The irradiation of U.V. light and the measurement of the hardness of film were similarly proceeded to the above-mentioned Examples 17~24.

The amount of initiator added to the mixture liquid (as weight parts per 100 weight parts of the oxetan derivative) and the hardness of film are shown in the following Table 8.

TABLE 8

| Example No. | Initiator | Amount of initiator | Hardness of film |
| --- | --- | --- | --- |
| 49 | Example 1 | 1 | 3H |
| 50 | Example 2 | 1 | 3H |
| 51 | Example 3 | 1 | 3H |
| 52 | Example 4 | 2 | H |

TABLE 8-continued

| Example No. | Initiator | Amount of initiator | Hardness of film |
| --- | --- | --- | --- |
| 53 | Example 5 | 1 | 2H |
| 54 | Example 6 | 1 | 3H |

INDUSTRIAL APPLICABILITY

Adhesives, sealants, paints, etc. which comprise cationically polymerizable material such as, for example, epoxy resin, etc. and the photo-latent initiator for photopolymerization of the present invention are usable as a functional macromolecule substance in any field that utilizes the light-transmission property.

In other words, the industrial field in which the above-mentioned functional macromolecule substances can be used is, for instance, the eletronic industries. For example, said substances are highly effective for solving problems such as, for example, shrinkage and thermal deformation of liquid crystal cell-sealing material in production of a liquid crystal panel, unstableness of a panel-sealing material, compatibility with a liquid crystal, outgassing during hardening step, etc.

Also, the photo-latent initiator for photopolymerization of the present invention allows the satisfaction of needs such as population in the mounting of electronic parts on a printed circuit board and fine patterning of a printed circuit board, which could not be satisfied by using the conventional resist that requires the joint use of light and heat for hardening. When the initiator of the present invention is used, it is also possible to produce a polymer by using, as one of means for hardening, a laser beam having the wavelength of 200~700 nm as single beam or as a combination of beams having different wavelength. It can also be applied to the preparation of fine patterning circuits with laser beam. Obviously, it can also be used in the field of semiconductors.

Other possible fields in which the initiator for photopolymerization of the present invention can be used are the aircraft industry, automobile industry, other vehicle industries, domestic electric appliances industry, housing industry, building material industry, and civil engineering and construction industries.

Additionally, since the initiator of the present invention allows the preparation of a non-solvent composition comprising epoxy resin by fusion-mixing method due to its good thermal stability, it can be used in the adhesives field, and enables the user to accomplish an effective production of adhesives having fewer burdens to the environment.

What is claimed is:

1. A photo-latent initiator for photopolymerization of cationically polymerizable organic material, wherein said initiator comprises a crystalline ion-association substance having a general formula (I):

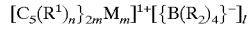

wherein M is a transition metal of center nucleus; $C_5$ is a cyclopentadienyl group; $R^1$ is an electron-donating substituent bonded to carbon atom of the cyclopentadienyl group; n is either 4 or 5; m is either 1 or 2; l is either 1 or 2; $R^2$ is a ligand coordinated to boron atom (B), and four ($R^2$)s are the same to each other.

2. The photo-latent initiator for photopolymerization claimed in claim 1, wherein said transition metal of center nucleus (M) in the general formula (I) is selected from a group consisting of Ti, Zr, Fe, Ru, and Os.

3. The photo-latent initiator for photopolymerization claimed in claim 1, wherein the electron-donating substituent ($R^1$) of cyclopentadienyl group in the general formula (I) is, either similar to or different from each other, selected from a group consisting of alkyl group, cycloalkyl group, alkoxyl group, aryl group, dialkyl group, and silyl group.

4. The photo-latent initiator for photopolymerization claimed in claim 1, wherein the mono-nucleus or di-nucleus structure metallocene derivative cation which composes the crystalline ion-association substance having the general formula (I) is selected from a group consisting of bis(1,2,3,4,5-pentamethylcyclopentadienyl)iron cation, bis(1-ethyl-2,3,4,5-tetramethylcyclopentadienyl)iron cation, bis(1-n-propyl-2,3,4,5-tetramethylcyclopentadienyl)iron cation, bis(1-phenyl-2,3,4,5-tetramethylcyclopentadienyl)iron cation, bis(1,2,3,4,5-pentaethylcyclopentadienyl)iron cation, bis(1-n-propyl-2,3,4,5-tetraethylcyclopentadienyl)iron cation, bis(1-phenyl-2,3,4,5-tetraethylcyclopentadienyl)iron cation and octamethylferrocenophane cation, octaethylferrocenophane cation, diferrocene derivative cation.

5. The photo-latent initiator for photopolymerization claimed in claim 1, wherein the ligand ($R^2$) in the general formula (I) is selected from a group consisting of aryl group, halogenated aryl group, halogen haloformaryl group, cycloalkynyl group, halogenated cycloalkyl group, halogenated cycloalkynyl group, cycloalkyloxy group, cycloalkenyloxy group, alkadienyl group, alkatrienyl group, alkynyl group, halogenated alkenyl group, halogenated alkadienyl group, halogenated alkatrienyl group, halogenated alkynyl group, and heterocyclic group.

6. The photo-latent initiator for photopolymerization claimed in claim 1, wherein the tetradentate borate complex anion which composes the crystalline ion-association substance having the general formula (I) is selectedfromagroup-consistingof tetrakis(4-fluorophenyl)borate anion, tetrakis(4-fluorobiphenyl)borate anion, tetrakis[3,5-bis (trifluoromethyl)phenyl]borate anion, tetrakis(3,5-difluorophenyl)borate anion, tetrakis[4-(trifluoromethyl) phenyl]borate anion, tetrakis(2,3,5,6-tetrafluorophenyl) borate anion, tetrakis(3,4,5-trifluorophenyl)borate anion, tetrakis(3-fluoropropane)borate anion, tetrakis[3,5-bis(1,1,1,3,3,3-hexafluoro-2-methoxy-2-propyl)phenyl]borate anion, tetrakis(2,4,6-trifluorophenyl)borate anion, tetrakis(nonafluorobutyl)borate anion, tetrakis(perfluorohexyl) borate anion, tetrakis(perfluoropentyl)borate anion, tetrakis (perfluorooctyl) borate anion, tetrakis(perfluoro-3-methylbutyl)borate anion, tetrakis(perfluoro-5-methylbutyl) borate anion, tetrakis(heptafluoropropyl)borate anion, tetrakis(3,5-dichlorophenyl)borate anion, tetrakis(4-chlorophenyl)borate anion, tetrakis(benzyl chloride)borate anion, tetrakis(chlorobenzyl)borate anion, tetrakis[2-(perfluorobutyl)ethyl]borate anion, tetrakis[2-(perfluorohexyl)ethyl]borate anion, tetrakis[2-(perfluorooctyl)ethyl]borate anion, tetrakis[2-(perfluoro-7-methyloctyl)ethyl]borate anion, tetrakis[2-(perfluoro-5-methylhexyl)ethyl]borate anion, tetrakis(2,2,3,3-tetrafluoropropyl)borate anion, tetrakis(1H,1H,5H-octafluoropentyl)borate anion, tetrakis(1H-perfluorohexyl) borate anion, tetrakis(1,1-difluoroethyl)borate anion, tetrakis[3,5-bis (trifluoromethyl)benzyl]borate anion, tetrakis[4-(trifluoromethyl)benzyl]borate anion, tetrakis(3,5-difluorobenzyl)borate anion, tetrakis(4-fluorobenzyl) borate anion, tetrakis(4-ethoxyphenyl)borate anion, tetrakis (4-methoxyphenyl)borate anion, tetrakis(4,5-dimethoxyphenyl)borate anion, tetrakis(4-butylphenyl) borate anion, tetrakis(tert-butylphenyl)borate anion, tetrakis (phenyl)borate anion, tetrakis(biphenyl)borate anion, tetrakis(terphenyl)borate anion, tetrakis(mesityl)borate anion, tetrakis(pentamethylphenyl)borate anion, tetrakis[3,5-(dimethyl)phenyl]borate anion, tetrakis(cyclopropyl) borate anion, tetrakis(cyclobutyl)borate anion, tetrakis (cyclohexyl)borate anion, tetrakis(cyclopentyl)borate anion, tetrakis(cyclooctyl)borate anion, and tetrakis(phenoxybutyl) borate anion.

\* \* \* \* \*

UNITED STATES PATENT AND TRADEMARK OFFICE
CERTIFICATE OF CORRECTION

PATENT NO. : 6,387,975 B1
DATED : May 14, 2002
INVENTOR(S) : Shin Hiwasa

It is certified that error appears in the above-identified patent and that said Letters Patent is hereby corrected as shown below:

Column 1,
Line 45, "Bronsted" should read -- Brønsted --.

Column 4,
Line 44, "Bronsted" should read -- Brønsted --.

Column 7,
Line 7, "5-tetrametyl" should read -- 5-tetramethyl --.

Column 8,
Line 19, "and soon" should read -- and so on --.
Line 44, "forphotopolymerization" should read -- for photopolymerization --.

Column 9,
Line 8, "pentamethylcyclopentadienl" should read -- pentamethylcyclopentadienyl --.

Column 11,
Line 39, "inventionhas" should read -- invention has --.
Line 44, "Fe centervia" should read -- Fe center via --.
Line 53, "permethyleyclo-" should read -- permethylcyclo- --.

Column 15,
Line 30, "theflask." should read -- the flask. --.
Line 67, "with amagnetic" should read -- with a magnetic --.

Column 16,
Line 2, "added to log" should read -- added to 10 g --.

Column 17,
Line 44, "1.69 gof" should read -- 1.69g of --.

Column 19,
Line 66, after "80º C." insert -- for --.

Column 20,
Line 6, after "with the pencil" insert -- hardness --.

Column 21,
Line 42, "60% prepared" should read -- 60% is prepared --.

UNITED STATES PATENT AND TRADEMARK OFFICE
CERTIFICATE OF CORRECTION

PATENT NO. : 6,387,975 B1
DATED : May 14, 2002
INVENTOR(S) : Shin Hiwasa

It is certified that error appears in the above-identified patent and that said Letters Patent is hereby corrected as shown below:

<u>Column 22,</u>
Line 23, "during hardening" should read -- during a hardening --.
Line 56, formula in claim 1, "[$C_5$" should read -- [{$C_5$ --.

<u>Column 23,</u>
Lines 34-35, in claim 6, "selectedfromagroupconsistingof" should read -- selected from a group consisting of --.

Signed and Sealed this

Eleventh Day of March, 2003

JAMES E. ROGAN
*Director of the United States Patent and Trademark Office*